(12) United States Patent
Hung

(10) Patent No.: US 7,205,174 B2
(45) Date of Patent: Apr. 17, 2007

(54) MICROMECHANICAL ACTUATOR WITH MULTIPLE-PLANE COMB ELECTRODES AND METHODS OF MAKING

(75) Inventor: Chang-Li Hung, Taipei (TW)

(73) Assignee: OPU Microsystems Application Corp., Taipei (TW)

( * ) Notice: Subject to any disclaimer, the term of this patent is extended or adjusted under 35 U.S.C. 154(b) by 59 days.

(21) Appl. No.: 11/224,119

(22) Filed: Sep. 13, 2005

(65) Prior Publication Data

US 2006/0008934 A1    Jan. 12, 2006

Related U.S. Application Data

(62) Division of application No. 10/793,877, filed on Mar. 8, 2004.

(51) Int. Cl.
*H01L 21/00* (2006.01)
(52) U.S. Cl. .............................. 438/52; 438/50; 438/51; 257/E29.324
(58) Field of Classification Search ................ 438/50, 438/51, 52, 53, 48; 257/414, 415, 417, 418, 257/420, E29.324
See application file for complete search history.

(56) References Cited

U.S. PATENT DOCUMENTS

| | | | | |
|---|---|---|---|---|
| 6,636,653 B2* | 10/2003 | Miracky et al. | ............... | 438/27 |
| 6,794,217 B2* | 9/2004 | Lee et al. | ...................... | 438/72 |
| 6,914,710 B1* | 7/2005 | Novotny et al. | ............ | 359/291 |
| 7,034,370 B2* | 4/2006 | Kuo | ............................ | 438/52 |
| 7,071,109 B2* | 7/2006 | Novotny et al. | ............ | 438/692 |
| 2001/0044165 A1* | 11/2001 | Lee et al. | ...................... | 438/52 |
| 2003/0203530 A1* | 10/2003 | Lee et al. | ...................... | 438/72 |

* cited by examiner

*Primary Examiner*—Kevin M. Picardat
(74) *Attorney, Agent, or Firm*—Lowe Hauptman & Berner, LLP

(57) ABSTRACT

A micro-electro-mechanical component comprising a movable element with comb electrodes, and two stationary elements with comb electrodes aligned and stacked on each other but electrically insulated by a layer of insulation material. The movable element is supported by multiple torsional hinges and suspended over a cavity such that the element can oscillate about an axis defined by the hinges. The comb electrodes of the movable element are interdigitated with the comb electrodes of one stationary element in the same plane to form an in-plane comb actuator. The comb electrodes of the movable element are also interdigitated in an elevated plane with the comb electrodes of another stationary element to form a vertical comb actuator. As a result, the micro-electro-mechanical component is both an in-plane actuator and a vertical comb actuator, or a multiple-plane actuator. Methods of fabricating such actuator are also described.

4 Claims, 11 Drawing Sheets

MICROMECHANICAL ACTUATOR WITH MULTIPLE-PLANE COMB ELECTRODES AND METHODS OF MAKING

This application is a divisional application of U.S. patent application Ser. No. 10/793,877, filed Mar. 8, 2004, and claims priority thereof and is hereby incorporated by reference for all purposes as if fully set forth herein.

BACKGROUND OF THE INVENTION

The present invention relates to a micro-electro-mechanical component, and more particularly to actuator.

Micro-electro-mechanical mirrors have great potential in wide variety of optical applications including optical communication, confocal microscope, laser radar, bar code scanning, laser printing and projection display. For some optical scanning applications such as laser printing and scanning projection display, the mirror needs to achieve large optical scanning angle at specific frequency. Large optical angle is also a key to optical resolution and smaller product footprint. For scanning mirror, this requirement poses a challenge in the design of actuator to generate large actuation force. A variety of micro-electro-mechanical actuator designs have been proposed to steer or scan light beam for various applications. In order to achieve deflection or movement of the micro-component out of the chip plane, it is known to design a movable element containing electrodes and a stationary element containing counter-electrodes such that the movable element can be driven by the electrical force.

In U.S. Pat. No. 6,595,055, Harald Schenk, et al described a micromechanical component with both the oscillating body and the frame or stationary layer located on the same chip plane. Capacitance is formed between the lateral surfaces of the oscillating body and the frame layer and will vary as the movable body oscillates about a pivot axis out of the chip plane. The structure is suspended and supported by an insulating layer and a substrate to allow out-of-plane motion of the oscillating body. They described in "Large Deflection Micromechanical Scanning Mirrors for Linear Scan and Pattern Generation" in Journal of Selected Topics in Quantum Electronics, Vol 6, No 5, 2000 that the scanning mirror can scan at large angle with low driving voltage at low frequency. However, movable comb electrodes located on the mirror perimeter will increase dynamic deformation of the mirror or movable body. Excessive dynamic deformation of scanning mirror will increase divergence of reflected light beam and significantly deteriorate optical resolution of the device for high speed scanning applications such as printing and scanned display. Additional electrode insulated from the structure may be required to perturb the symmetry of the setup in order to quickly initiate oscillation of the mirror. Furthermore, the setup only allows analog operation (scanning) but not digital operation (static angle positioning) of the movable body.

R. Conant describes in "Staggered Torsional Electrostatic Combdrive and Method of Forming SAME" (U.S. patent application No. 2003/0019832), a comb-drive actuator with a stationary comb teeth assembly and a moving comb teeth assembly with a mirror and a torsional hinge, and the method of fabricating such devices. The moving assembly is positioned entirely above the stationary assembly by a predetermined vertical displacement during resting state. The actuator is able to scan at relative high frequency with mirror dynamic deformation lower than the Rayleigh limit. However, the optical scan angle which dominates the optical resolution is notably smaller than what Schenk has reported despite a relative high voltage is applied. An alternate design was proposed with additional stationary comb teeth assemblies stacked on top of the stationary comb teeth assembly. This stacked comb teeth assemblies were claimed to be used for the purpose of capacitive sensing and frequency tuning of the movable assembly despite that the method of frequency tuning was not described. In the fabrication process steps, a process step is required to open alignment windows by etching through the top wafer to reach the insulating oxide layer then removing the oxide layer in order to use features located on the bottom wafer for alignment of subsequent steps. If the top wafer is thick for the purpose of minimizing dynamic deformation, this process could be time-consuming and hence, expensive.

S. Olav describes in "Self-Aligned Vertical Combdrive Actuator and Method of Fabrication" (US Patent Application US2003/0073261), a vertical comb-drive actuator with small gaps between comb teeth for increased torsional deflection, a double-sided vertical comb-drive actuator for dual-mode actuation, vertical piston and scan, and the method of making them. Despite the proposed fabrication process steps allow self-alignment of the embedded comb teeth, the process of vertical comb-drive actuator requires highly skilled techniques to etch the bottom comb teeth and twice deep silicon trench etching of the bottom substrate. For dual-mode vertical comb-drive actuator, the fabrication process steps start with deep silicon trench etching of the device layer of a Silicon-On-Insulator (SOI) wafer then fusion bonding to another silicon wafer that resulting in a complex five-layer structure, two insulation oxide layers and three silicon layers. To form the bottom comb teeth highly skilled self-alignment etching techniques and twice deep silicon trench etching are still required.

SUMMARY OF THE INVENTION

It is the objective of the present invention to provide a-micro-electro-mechanical actuator with in-plane comb electrodes and a supporting substrate with a cavity of specific depth.

It is the objective of the present invention to provide a micro-electro-mechanical actuator with both in-plane and vertical comb electrodes that increase the actuation force on the movable element, and the methods of fabricating such device.

It is a further objective of this invention to provide a micro-electro-mechanical actuator with both in-plane and dual-side vertical comb electrodes that increase the actuation force on the movable element, and the methods of fabricating such devices.

It is another objective of this invention to provide a method to support and fan out the bottom electrodes of the vertical comb electrodes.

It is another objective of this invention to provide a torsional hinge design with built-in electrodes that can be used to increase the effective torsional stiffness of the hinges such that the resonance frequency of the movable element in an actuator can be adjusted.

It is another objective of this invention to provide a method to decrease the effective torsional stiffness of the torsional hinges such that the resonance frequency of the movable element in an actuator can be adjusted.

DETAILED DESCRIPTION OF THE PREFERRED EMBODIMENTS

Figure 1A:
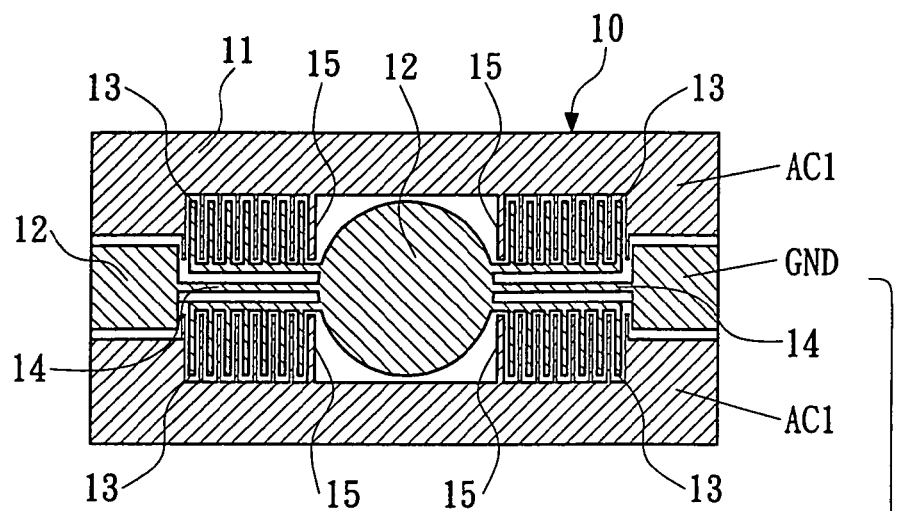
FIGS. 1A, 1B, and 1C show the top views of the top, middle and bottom layers of one embodiment of the present invention.
Figure 1B:
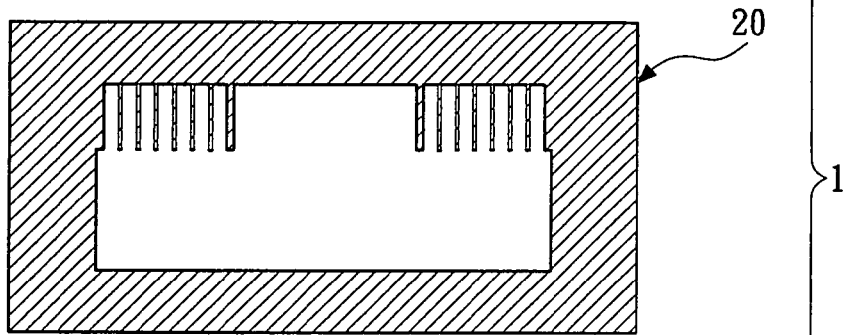
Figure 1C:
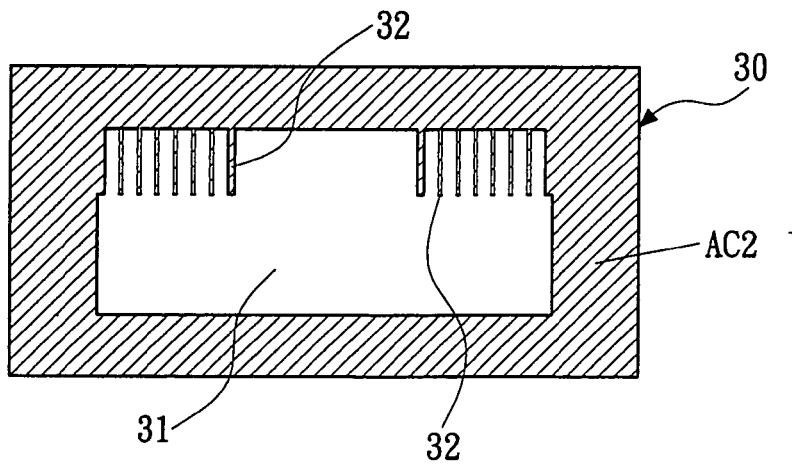

FIGS. 1A, 1B and 1C show the exploded top views of the three layers of a MEMS actuator in accordance with one embodiment of the present invention. Top layer, FIG. 1A, is consisted of a stationary and a movable elements both made of electrically conductive material, typically doped single crystal silicon. Movable element including comb electrodes is supported by multiple torsional hinges and is electrically isolated from stationary structure. The stationary element has comb electrodes that are interdigitated in the same horizontal plane with the comb electrodes of the movable element such that the top layer is an in-plane comb-drive actuator. Middle layer, FIG. 1B, is made of electrically non-conductive material, typically silicon dioxide. Bottom layer, FIG. 1C, consisting of a cavity and stationary comb electrodes located on one side of the torsional hinge, is made of electrically conductive material, typically doped single crystal silicon. Stationary comb electrodes on bottom layer are interdigitated with comb electrodes of the movable element on top layer such that the movable element and the bottom layer form a vertical comb-drive actuator. Middle and bottom layers support the top layer while middle layer electrically isolates top and bottom layers. As a result, the MEMS actuator is consisted of both in-plane and vertical comb-drive actuators.

Figure 3:
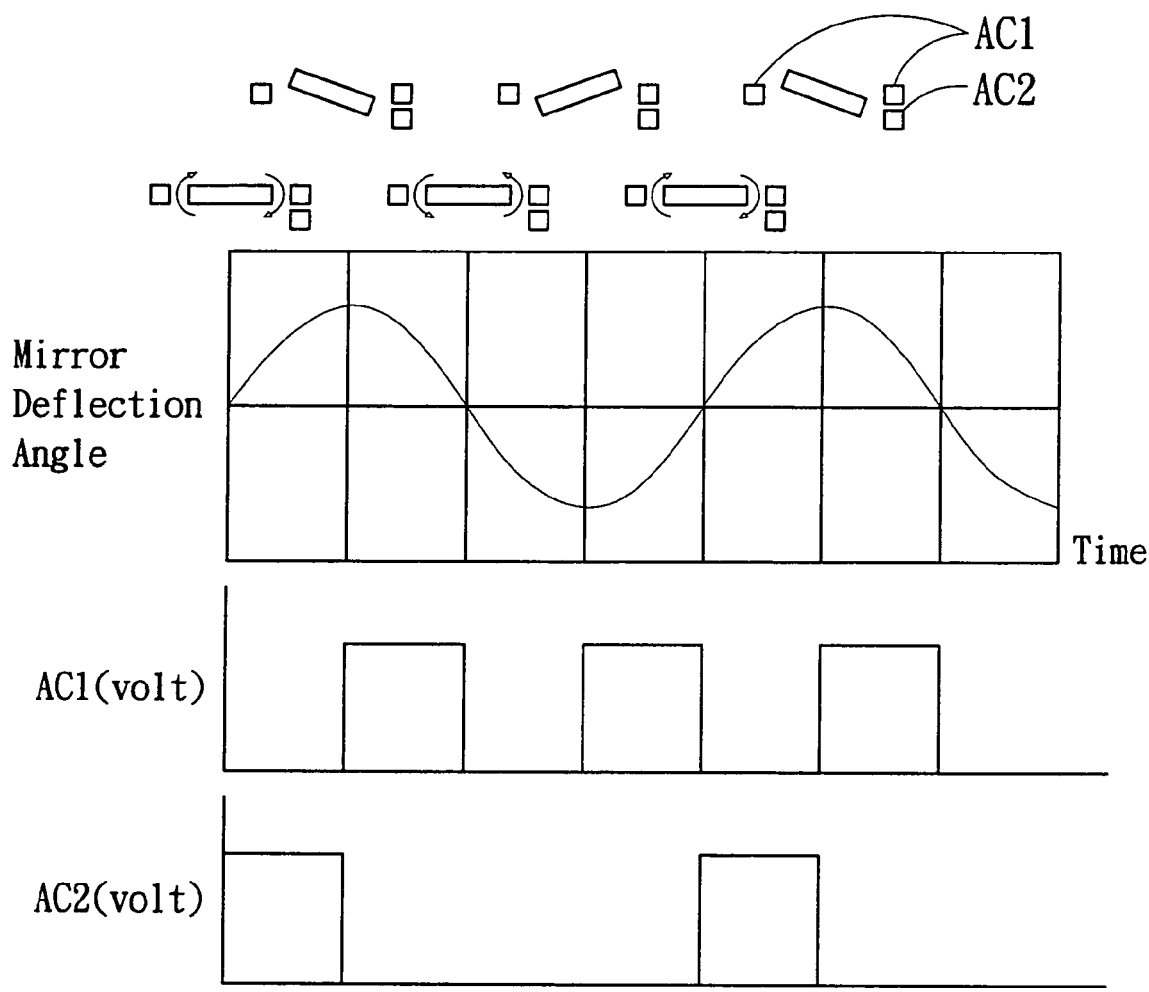
FIG. 3 illustrates one example of the relationship between the phase of mirror deflection angle and the phase of applied voltage sources for MEMS actuator depicted in FIG. 2.

The movable element is typically connected to electrical ground while the stationary element on the top layer is connected to a voltage source and the bottom layer is connected to another voltage source. FIG. 3 illustrates the phase and amplitude relationships between deflection angle of movable element and applied voltage sources. The waveform of the voltage source can be square, triangular, sinusoidal, half-sinusoidal or other shapes to meet specific angular velocity needs.

Figure 1D:
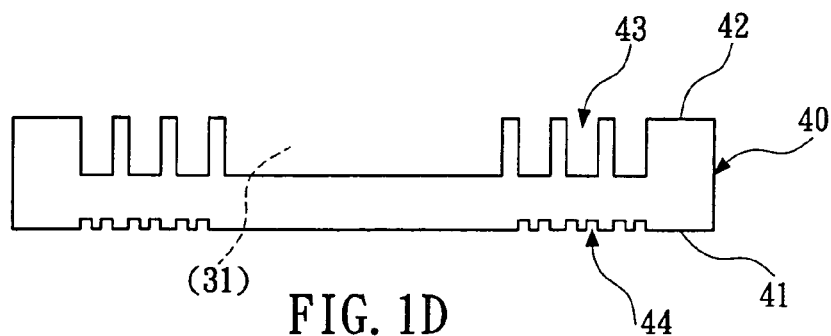
FIGS. 1D, 1E and 1F illustrate the fabrication process flow steps of the embodiment described in FIGS. 1A, 1B and 1C.
Figure 1E:
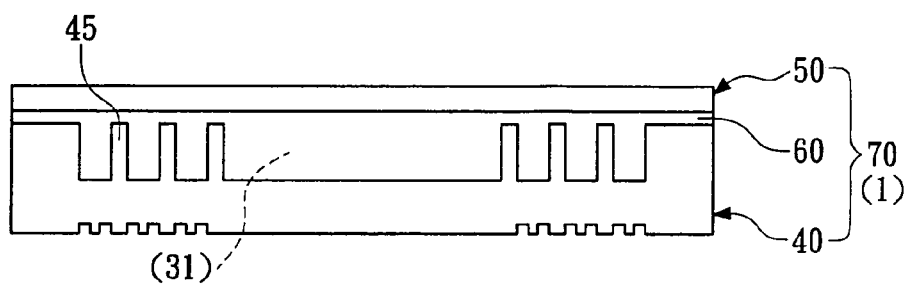
Figure 1F:
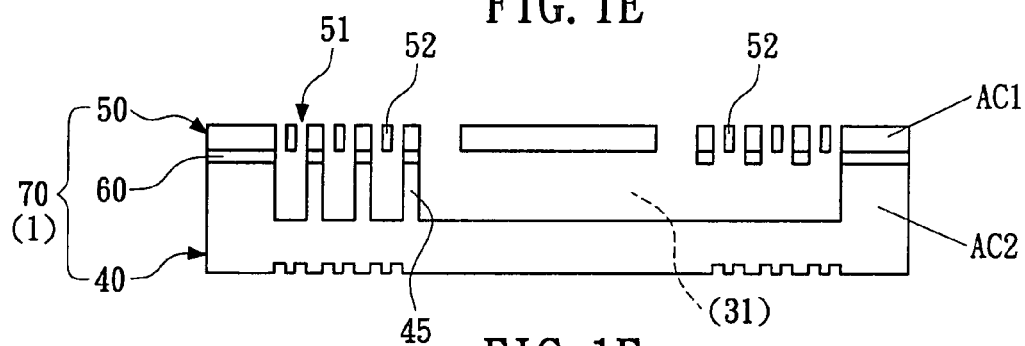

FIG. 1D–1F illustrate one method of fabricating the comb-drive actuator in accordance with one embodiment of the present invention as described in FIG 1A–1C. The first step, FIG 1D, starts by etching the backside of a semiconductor wafer, preferably single crystal silicon then etches the front-side using deep reactive ion etching (DRIE) with the etched features on backside for alignment. The next step is to fusion bond the double-side etched wafer to another wafer coated with silicon dioxide then annealed to increase bonding strength. The bonded wafer becomes a three layer structure and the top layer may be ground and polished to desired thickness and to the required surface quality, FIG. 1E. The top layer is then DRIE etched down to the middle layer using the backside features for alignment and the movable element of the three-layer structure is released by removing the silicon dioxide connecting to the stationary elements, FIG 1F.

Figure 1G:
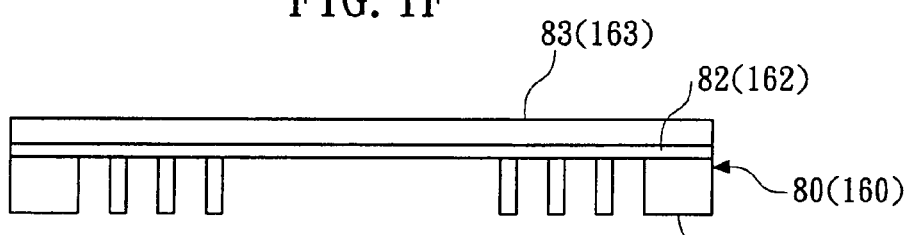
FIGS. 1G and 1H illustrate another fabrication process flow steps of the embodiment described in FIGS. 1A, 1B and 1C.
Figure 1H:
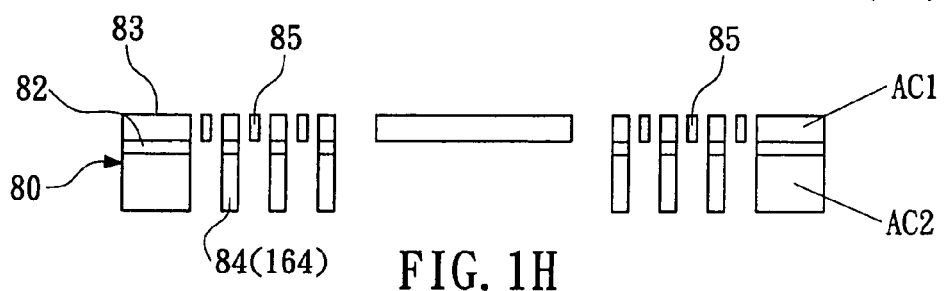

FIGS. 1G and 1H illustrate another fabrication method of the comb-drive actuator. The process starts with back-side DRIE etching to the middle oxide layer of a silicon-on-insulator (SOI) wafer, FIG. 1G. The wafer is then etched from the front-side of the wafer to the middle oxide layer, FIG. 1H. The movable element of the three-layer structure is then released by removing the silicon dioxide connecting to the stationary elements.

Figure 2A:
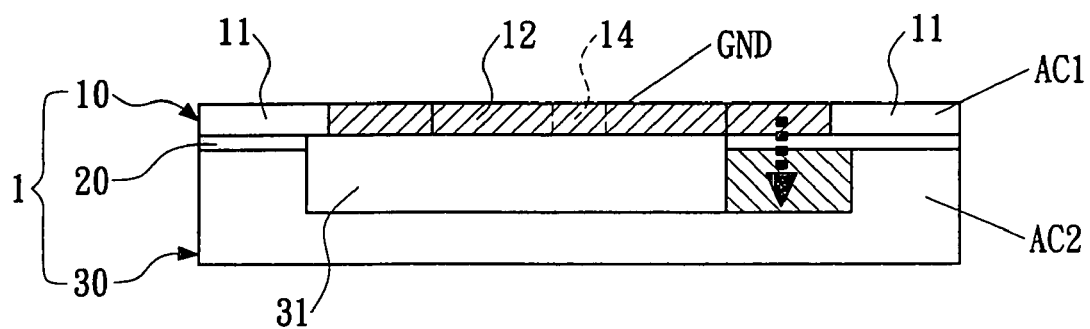
FIG. 2A~2D illustrate another side view of the embodiment described in FIG. 1 and show the relationship of actuation force of in-plane and vertical comb electrodes when the mobile element of top layer is in oscillation motion. The vertical comb electrodes on the bottom layer are located only on one side of the torsional hinges.
Figure 2B:
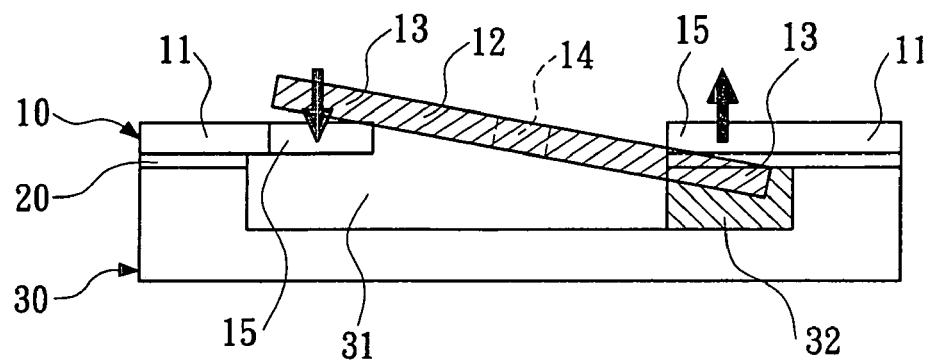
Figure 2C:
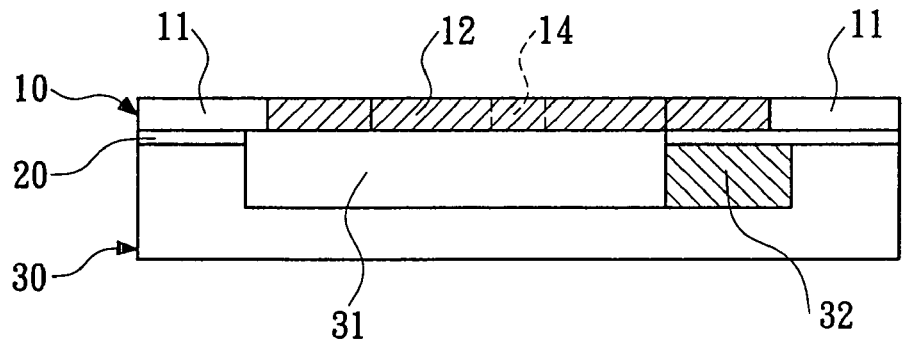
Figure 2D:
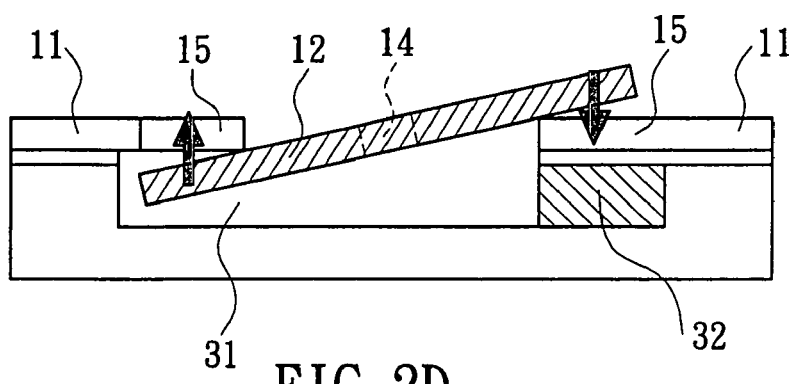

FIG. 2A–2D and FIG. 3 show the operation of the MEMS actuator as described in FIG. 1. The movable element is connected to electrical ground, the top stationary comb electrodes and the bottom stationary comb electrodes are connected to the first and the second AC voltage sources, respectively as shown in FIG. 2A. Top stationary and movable elements form an in-plane comb actuator whereas bottom stationary element and top movable element form a vertical comb actuator. The movable element starts oscillation with respect to the torsional hinges through either the unbalance of electrostatic force in the in-plane comb actuator or the electrostatic attraction from the vertical actuator, FIG. 2A. The unbalance force in the in-plane comb may be introduced from manufacturing tolerances or intentional design features. Electrostatic attraction force from the vertical comb actuator will rotate the movable element with respect to the torsional hinges to the maximum deflection angle, FIG. 2A~2B. After the movable element reaches the largest deflection angle, electrostatic attraction force from the in-plane comb actuator will be applied to the movable element until horizontal position is restored, FIG. 2B~2C. The movable element continues to rotate without actuation force to another maximum deflection angle, FIG. 2C~2D. After the movable element reaches another maximum deflection angle, electrostatic attraction force from the in-plane comb actuator will again be applied to the movable element until horizontal position is restored to complete one oscillation cycle, FIG. 2D~2A.

Figure 4:
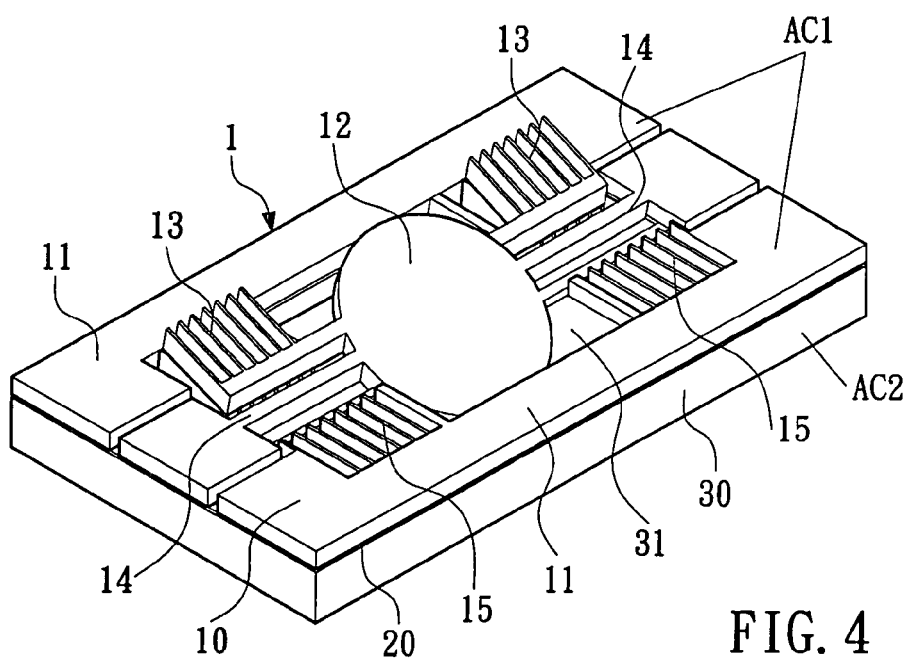
FIG. 4 illustrates the three dimensional view of the present invention where the mobile element is supported by a pair of torsional hinges and actuated by both in-plane and vertical comb structure.

FIG. 3 illustrates the relationship of the applied voltage sources and the operation of the MEMS actuator corresponding to FIG. 2. The movable element is typically designed to oscillate at or near its resonance frequency of primary oscillation mode. The movable element including top movable comb electrodes is connected electrical ground. The first voltage source AC1 is applied to the top stationary structure with in-plane comb electrodes. The second voltage source AC2 is applied to the bottom stationary comb electrodes. The frequency of voltage source AC1 is typically twice the oscillation frequency of the movable element. The frequency of voltage source AC2 is the same as the oscillation frequency of the movable element. The waveform of AC1 and AC2 can be various shapes to achieve desired angular velocity of the movable element. Typically, waveform of square shape gives the highest efficiency in driving the movable element to the largest rotation angle under given amplitude of AC1 and AC2. FIG. 4 shows a three-dimensional view of the MEMS actuator with movable element rotating to its largest angle.

The present invention combines both in-plane and vertical comb actuators to drive the movable element to oscillate at large angle and at high frequency. Furthermore, the cavity depth in the bottom layer of the actuator, described in fabrication flow of FIGS. 1D, 1E and 1F, can be designed to be a mechanical stop to prevent excess deflection of the movable structure that could induce mechanical failure of the actuator.

Figure 5A:
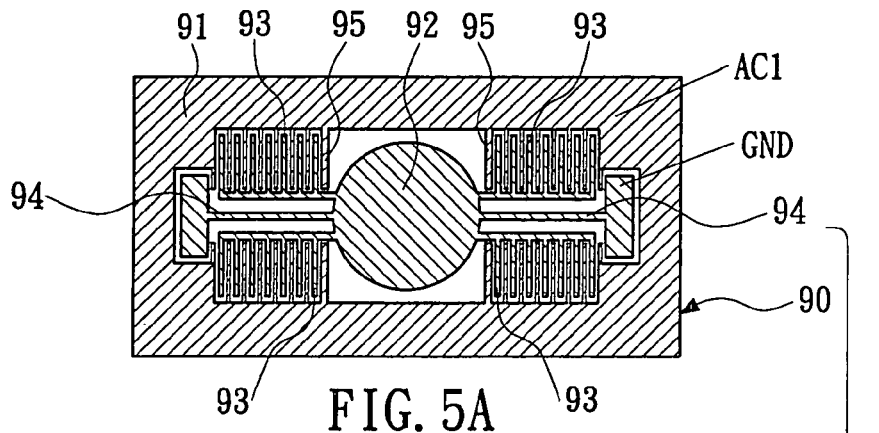
FIGS. 5A, 5B, and 5C show the top views of the top, middle and bottom layers of another embodiment of present invention where vertical comb electrodes on the bottom layer are electrically isolated into two halves of the different sides of the torsional hinges. Three voltage sources can be applied to achieve large actuation force on the mobile element.
Figure 5B:
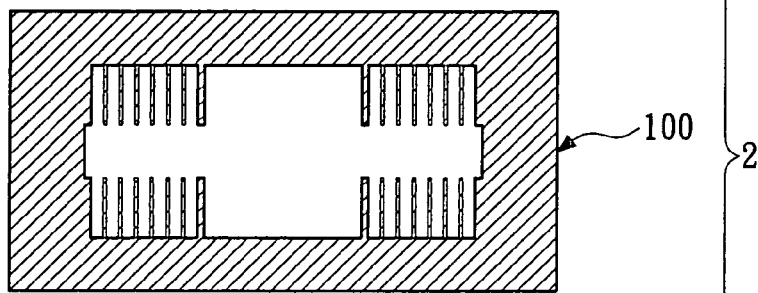
Figure 5C:
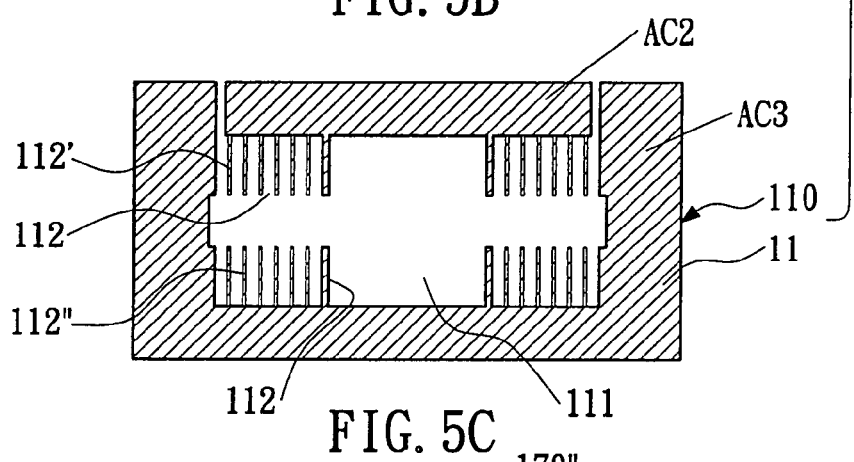

FIGS. 5A, 5B and 5C show the exploded top views of the three layers of a MEMS actuator in accordance with another embodiment of the present invention. Top layer, FIG. 5A, is consisted of a stationary and a movable elements, both made of electrically conductive material, typically doped single crystal silicon. Movable element including comb electrodes is supported by multiple torsional hinges and is electrically isolated from stationary structure. The stationary element has comb electrodes that are interdigitated in the same horizontal plane with the comb electrodes of the movable element such that the top layer is an in-plane comb-drive actuator. Middle layer, FIG. 5B, is made of electrically non-conductive material, typically silicon dioxide. Bottom layer, FIG. 5C, consisting of a cavity and stationary comb electrodes, is made of electrically conductive material, typically doped single crystal silicon. Comb electrodes on the bottom layer are electrically isolated into two halves located on different sides of the torsional hinges. Stationary comb electrodes on bottom layer are interdigitated with comb electrodes of the movable element on top layer such that the movable element and the bottom layer form a vertical comb-drive actuator with dual-side driving capability. Middle and bottom layers support the top layer while middle layer electrically isolates top and bottom layers. As a result, the MEMS actuator is consisted of both in-plane and vertical comb-drive actuators.

FIG. 6A–6D illustrate one method of fabricating the comb-drive actuator in accordance with the embodiment as described in FIG. 5A–5C. The first step, FIG. 6A, starts by etching the backside of a semiconductor wafer, preferably single crystal silicon then etches the front-side using deep reactive ion etching (DRIE) with the etched features on backside for alignment. Cavity size and depth, and the stationary vertical comb electrodes are defined. The next step is to fusion bond the double-side etched wafer to another wafer coated with silicon dioxide then annealed to increase bonding strength, FIG. 6B. The bonded wafer becomes a three layer structure and the top layer may be ground and polished to desired thickness and to the required surface quality. Backside of the bonded wafer is separated into two halves using DRIE, FIG. 6C. Since the bottom layer is bonded to the top layer so the three layer structure remains intact. The top layer is then DRIE etched down to the middle layer using the backside features for alignment and the movable element of the three-layer structure is released by removing the silicon dioxide connecting to the stationary elements, FIG. 6D.

The comb-drive actuator, described in FIGS. 5A, 5B and 5C, can also be fabricated using process flow steps of FIGS. 1G and 1H. The process starts with back-side DRIE etching of the bottom layer to the middle oxide layer of a SOI wafer and also separates the bottom layer into two halves, FIG. 1G. Since the bottom layer is bonded to the top layer so the three layer structure remains intact. The wafer is then etched from the front-side of the wafer to the middle oxide layer, FIG 1H. The movable element of the three-layer structure is then released by removing the silicon dioxide connecting to the stationary elements.

Figure 5D:
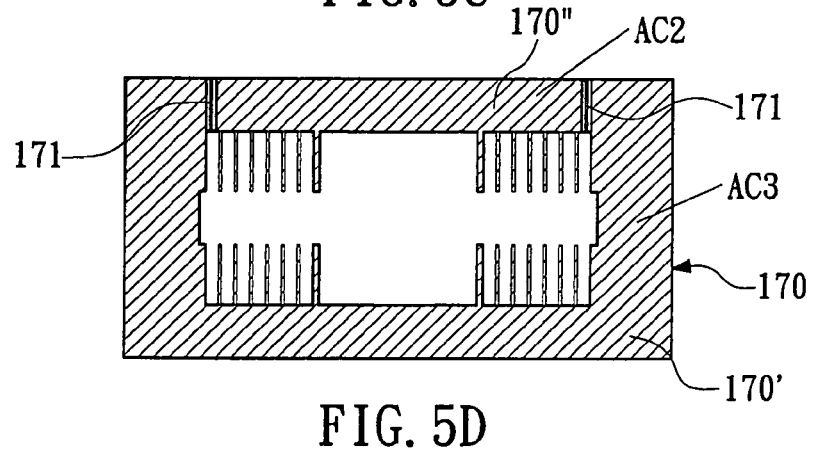
FIG. 5D illustrates another design of the bottom layer of the embodiment as depicted in FIG. 5C. The two sets of electrically isolated vertical comb electrodes are reinforced through thin film deposition processes.
Figure 6A:
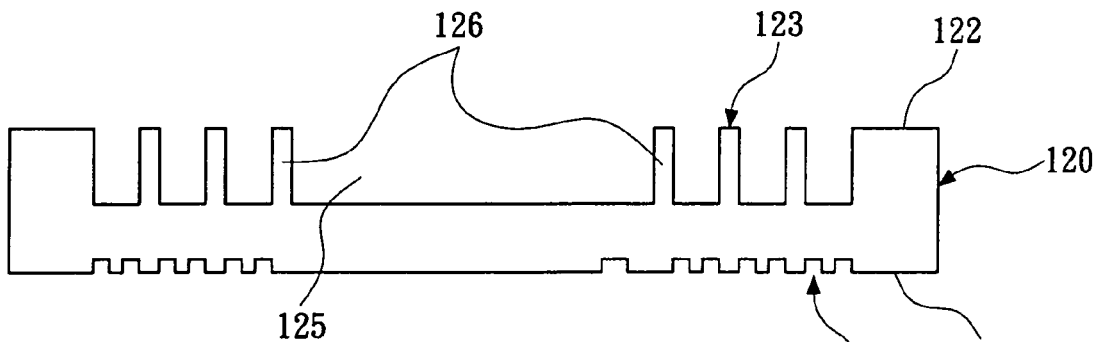
FIG. 6A~6D illustrate one fabrication process flow steps of the embodiment as described in FIGS. 5A, 5B and 5C.
Figure 6B:
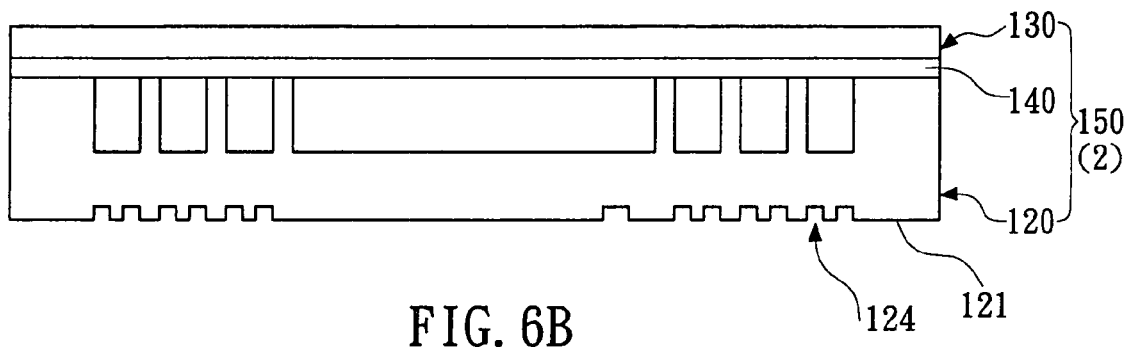
Figure 6C:
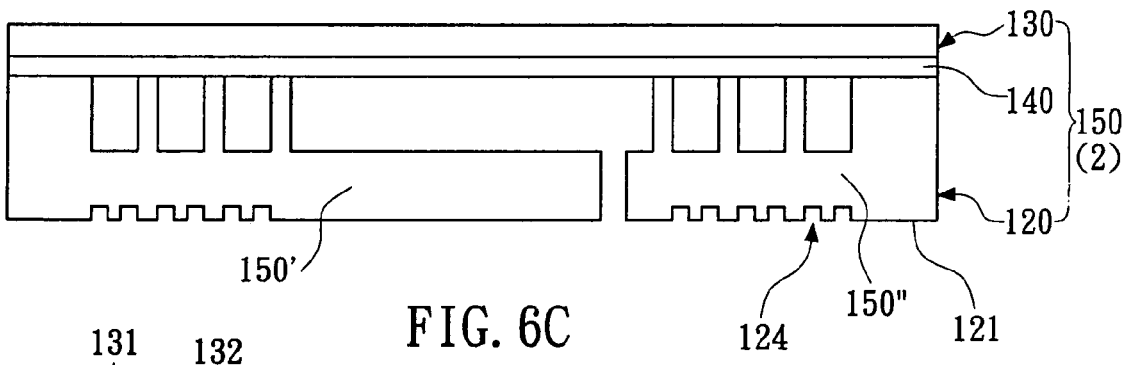
Figure 6D:
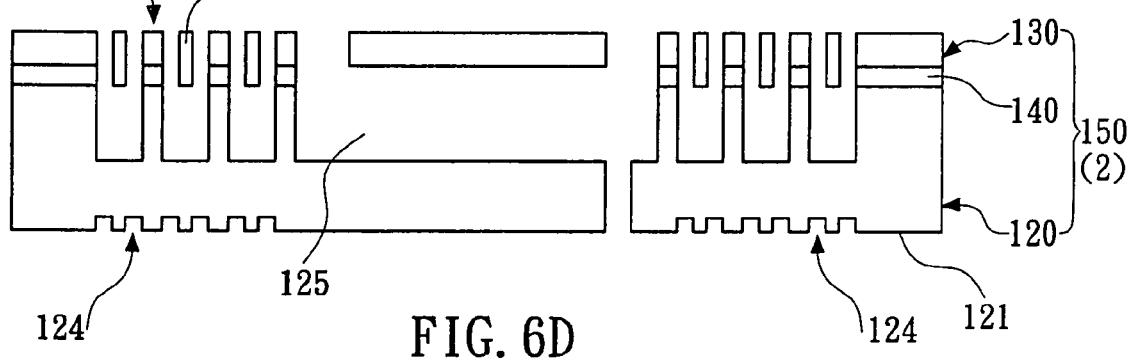
Figure 7A:
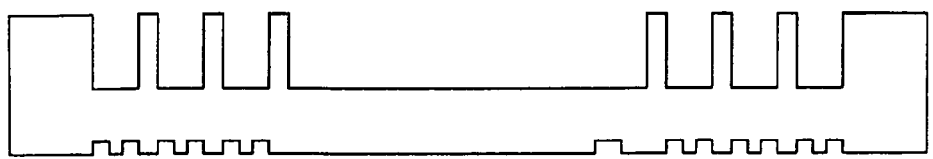
FIG. 7A~7F illustrate the fabrication process flow steps of the embodiment as described in FIGS. 5A, 5B and 5D.
Figure 7B:
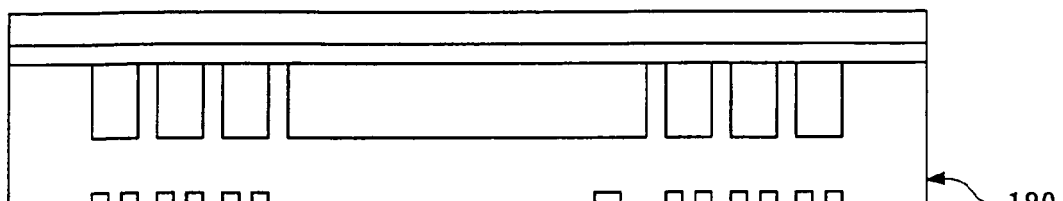
Figure 7C:
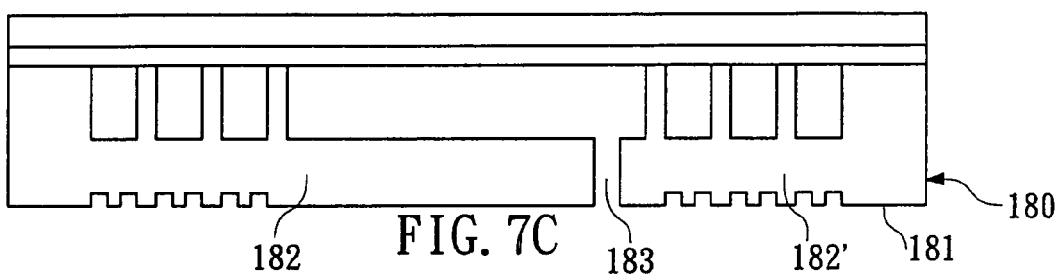
Figure 7D:
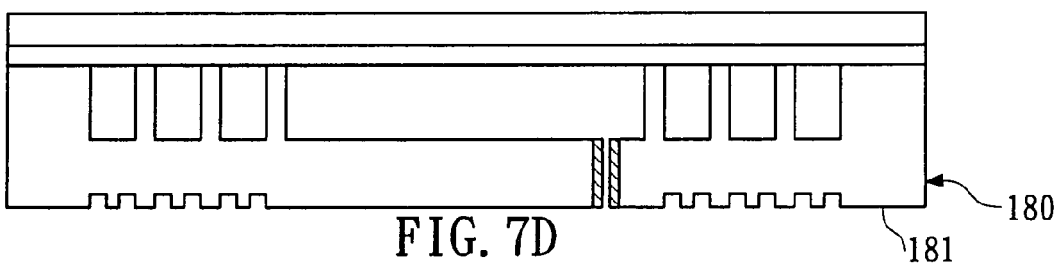
Figure 7E:
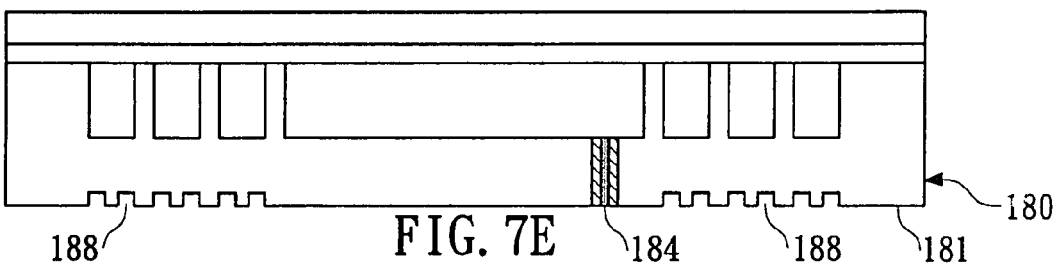
Figure 7F:
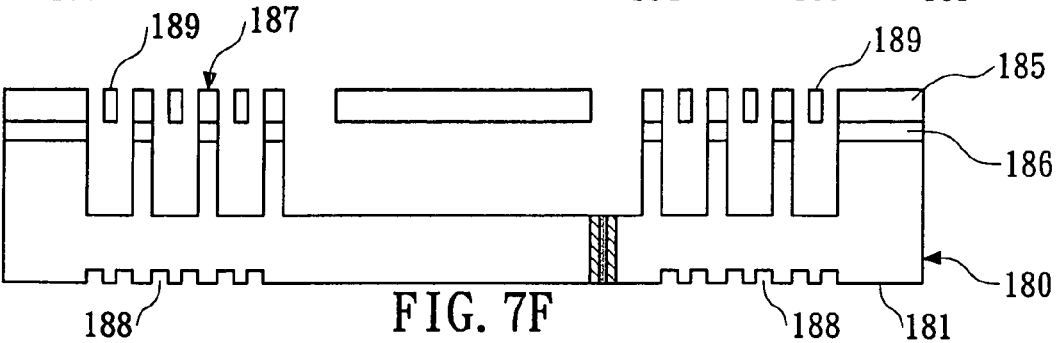
Figure 8A:
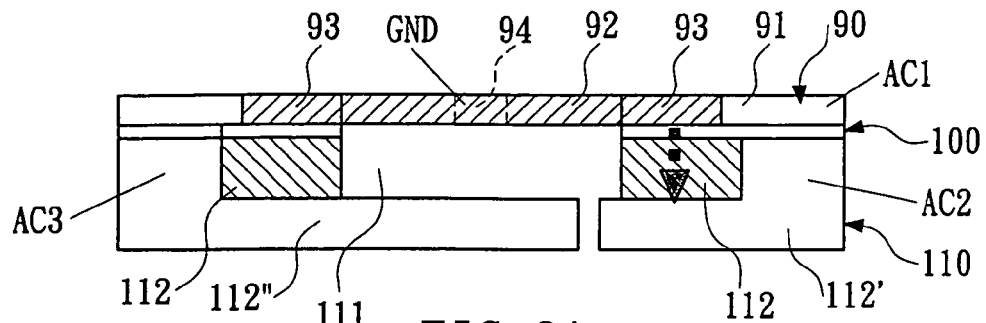
FIGS. 8A~8D illustrate the side view of the embodiment as described in FIG. 5 and show the relationship of actuation force of in-plane and vertical comb electrodes when the mobile structure of top layer is in oscillation motion. The vertical comb electrodes on the bottom layer are electrically isolated on each side of the torsional hinges.
Figure 8B:
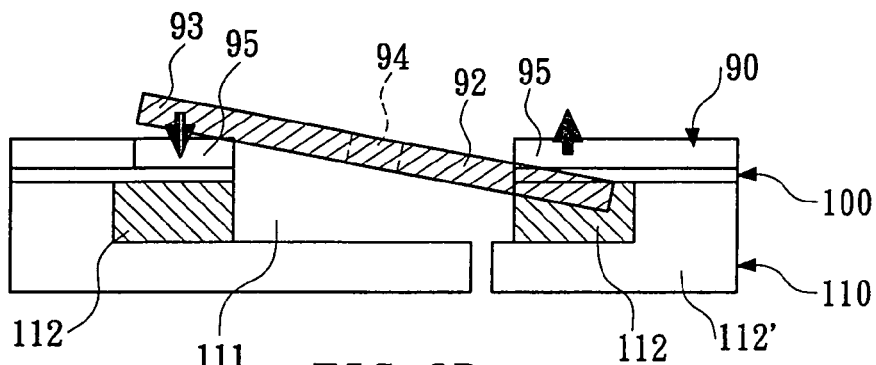
Figure 8C:
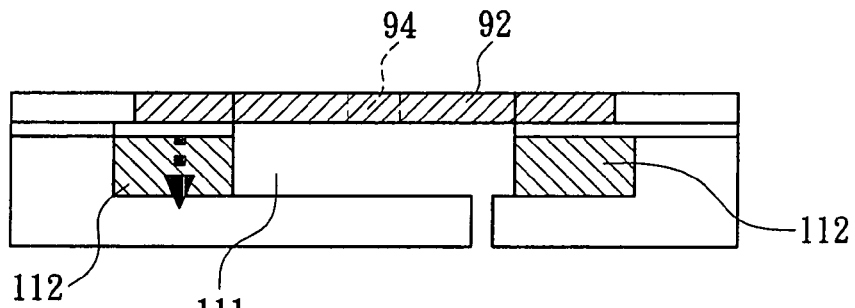
Figure 8D:
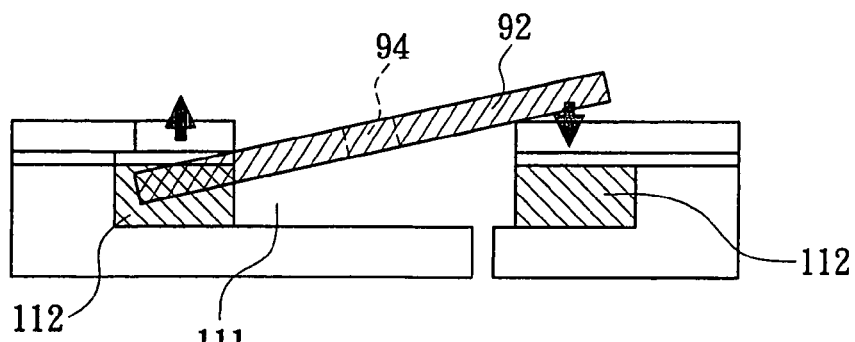

FIG. 5D shows a variation of the bottom layer as described in FIG. 5C. The bottom layer are electrically isolated into two halves and reinforced with thin film deposited materials. The reinforcement materials must have electrically non-conductive materials such as silicon dioxide. The comb-drive actuator, defined by FIGS. 5A, 5B and 5D, can be fabricated with process steps of FIG. 7A~7F. Process steps of FIG. 7A~7C is the same as process steps of FIG. 6A~6C. After the backside of wafer is etched and separated into two halves, FIG. 7C, electrically isolated material such as silicon dioxide is deposited on the backside and the opened channels using thin film processes, FIG. 7D. Another layer of material, such as polysilicon, is further deposited on the backside and the opened channels to complete the reinforcement, FIG. 7E. The thin film materials on the backside may be removed by grinding and polishing. Top layer is then DRIE etched down to the middle layer using the backside features for alignment and the movable element of the three-layer structure is released by removing the silicon dioxide connecting to the stationary elements, FIG 7F.

Figure 9:
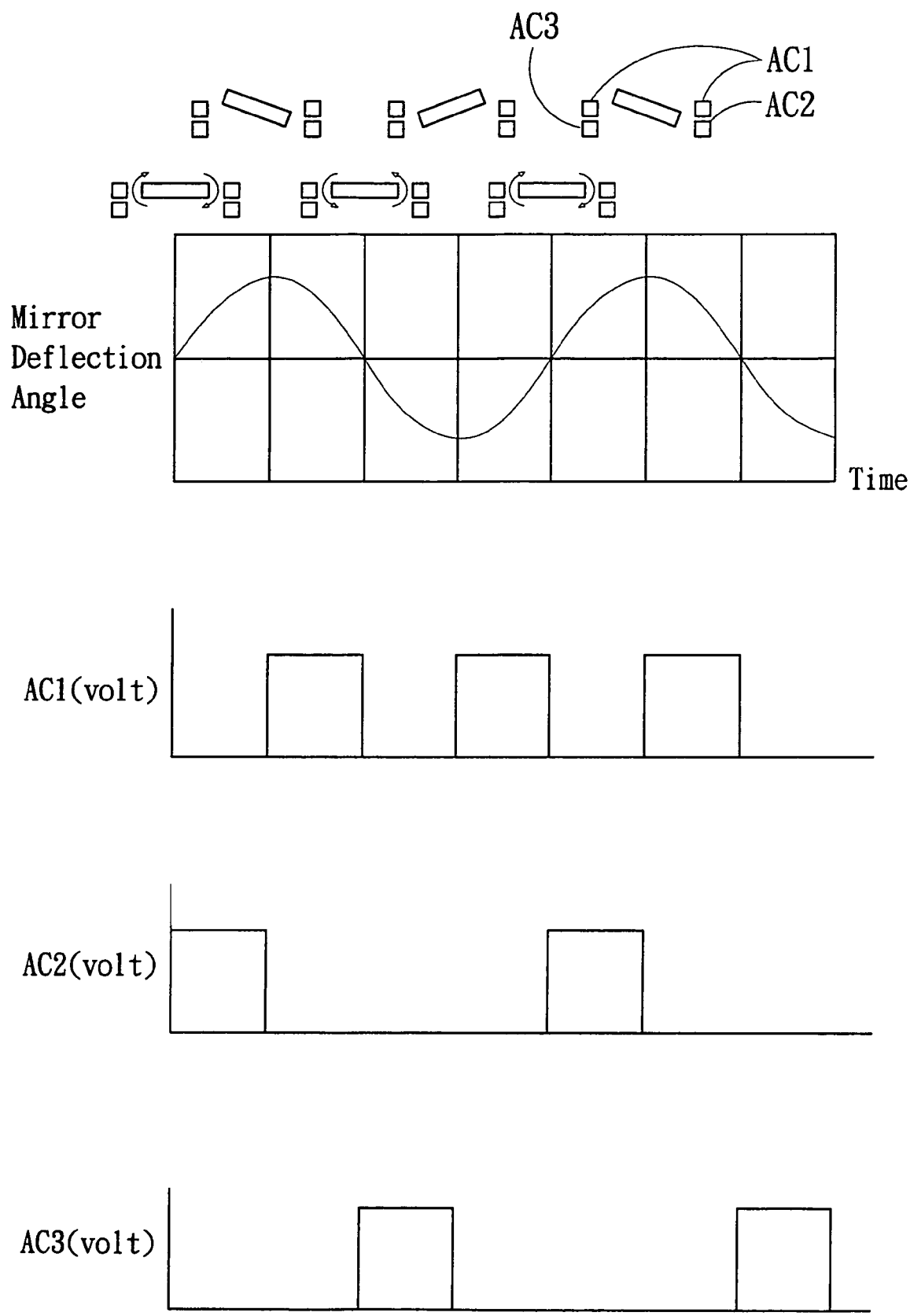
FIG. 9 illustrates one example of the relationship between the phase of mirror deflection angle and the phase of applied voltage sources for MEMS actuator depicted in FIG. 8.

FIG. 8 and FIG. 9 illustrate the operation of the MEMS actuator as described in FIG. 5. Movable element on top layer is connected to electrical ground while stationary comb electrodes is connected the first AC voltage source. The two sets of bottom stationary comb electrodes are connected to the second and the third AC voltage sources, respectively as shown in FIG. 8A. Movable element starts oscillation with respect to the torsional hinges through either the unbalance of electrostatic force in the in-plane comb electrodes or the electrostatic attraction from the vertical comb electrodes, FIG. 8A. The unbalance force in the in-plane comb may be introduced from manufacturing tolerances or intentional design features. Electrostatic attraction force from one side of the vertical comb actuator will rotate the movable element with respect to the torsional hinges to the maximum deflection angle, FIG. 8A~8B. After the movable element reaches the largest deflection angle, electrostatic attraction force from the in-plane comb actuator will be applied to the movable element until horizontal position is restored, FIG. 8B~8C. Electrostatic attraction force from another side of the vertical comb electrodes will rotate the movable element to another maximum deflection angle, FIG. 8C~8D. After the movable element reaches another maximum deflection angle, electrostatic attraction force from the in-plane comb actuator will again be applied to the movable element until horizontal position is restored to complete one oscillation cycle, FIG. 8D~8A.

FIG. 9 illustrates the relationship of the applied voltage sources and the operation of the MEMS actuator corresponding to FIG. 5. The movable element is typically designed to oscillate at or near its resonance frequency of primary oscillation mode. The movable element including top movable comb electrodes is connected electrical ground. First voltage source AC1 is applied to the top stationary structure with in-plane comb electrodes. Second voltage source AC2 is applied to one set of the bottom stationary comb electrodes. Third voltage source AC3 is applied to another set of the bottom stationary comb electrodes. The frequency of voltage source AC1 is typically twice the oscillation frequency of the movable element. The frequency of voltage sources AC2 and AC3 are the same as the oscillation frequency of the movable element but at different phases. The waveform of AC1, AC2 and AC3 can be various shapes to achieve desired angular velocity of the movable element. Typically, waveform of square shape gives the highest efficiency in driving the movable element to the largest rotation angle under given amplitude of AC1, AC2 and AC3.

Figure 10A:
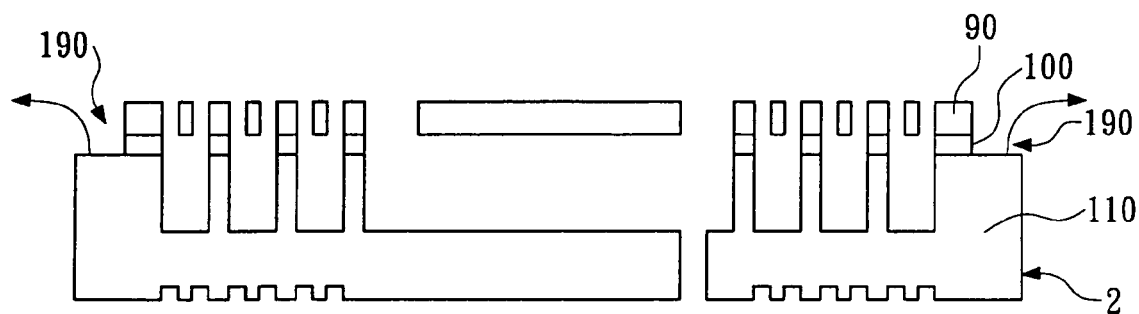
FIGS. 10A, 10B, and 10C illustrate the methods to connect the two set of electrically isolated vertical comb electrodes located on the bottom layer of the actuator as described in FIG. 1 and FIG. 5.

FIG. 10A illustrates a method to form electrical connections to the bottom layer of the actuator with SOI structure. Additional openings on the top layer are etched in DRIE etching process step as described in FIG. 1F, 1H, 6D or 7F to expose access to the middle layer. Electrical insulation material of the middle layer in the exposed area is then removed during structure release process. Connections can be made to the bottom layer through conventional methods, such as wire-bonding after deposition of metallic contact pad.

Figure 10B:
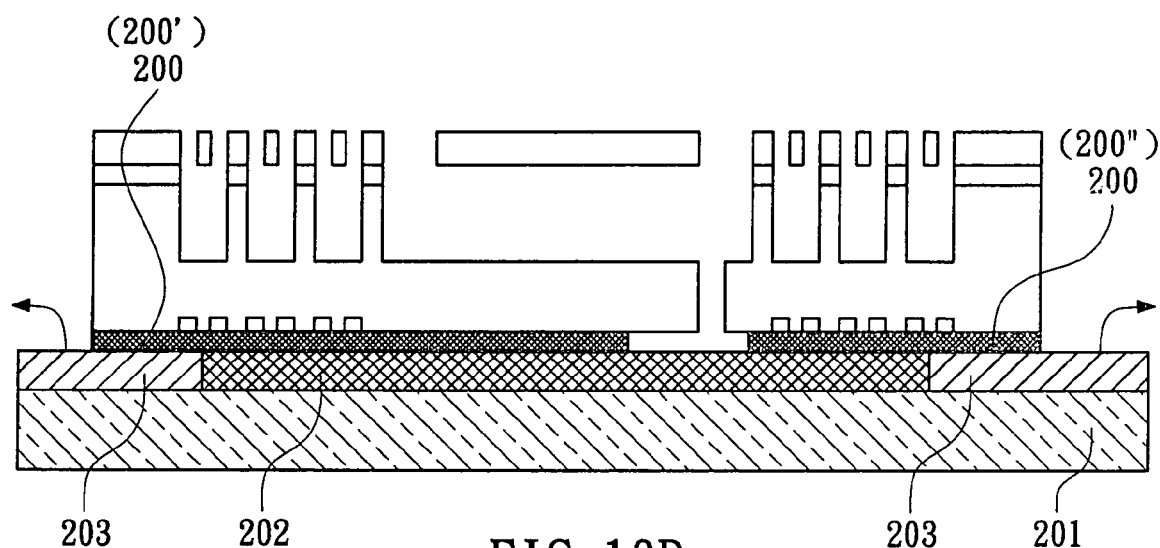
Figure 10C:
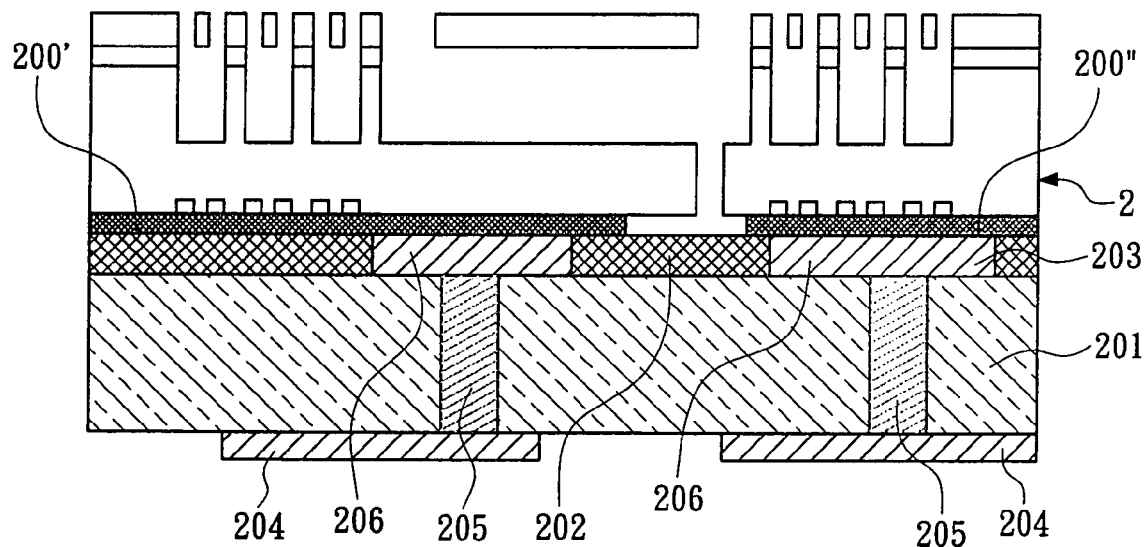

FIGS. 10B and 10C illustrate another method to form electrical connections to the bottom layer of the actuator with SOI structure. The SOI structure is connected to a substrate through a layer of electrically conductive material which is separated into two halves to avoiding electrical bridging. The conductive material may be conductive paste, conductive film, solder paste, etc. The substrate is configured for fan-out of the bottom comb electrodes. Dielectric material is disposed on the substrate which insulates the metal conductor pads on she substrate. Fan-out can be done on the from the top side conductor pads of the substrate, FIG. 11B or from bottom side conductor pads connecting to top side conductor pads through via holes, FIG. 11C.

Figure 11:
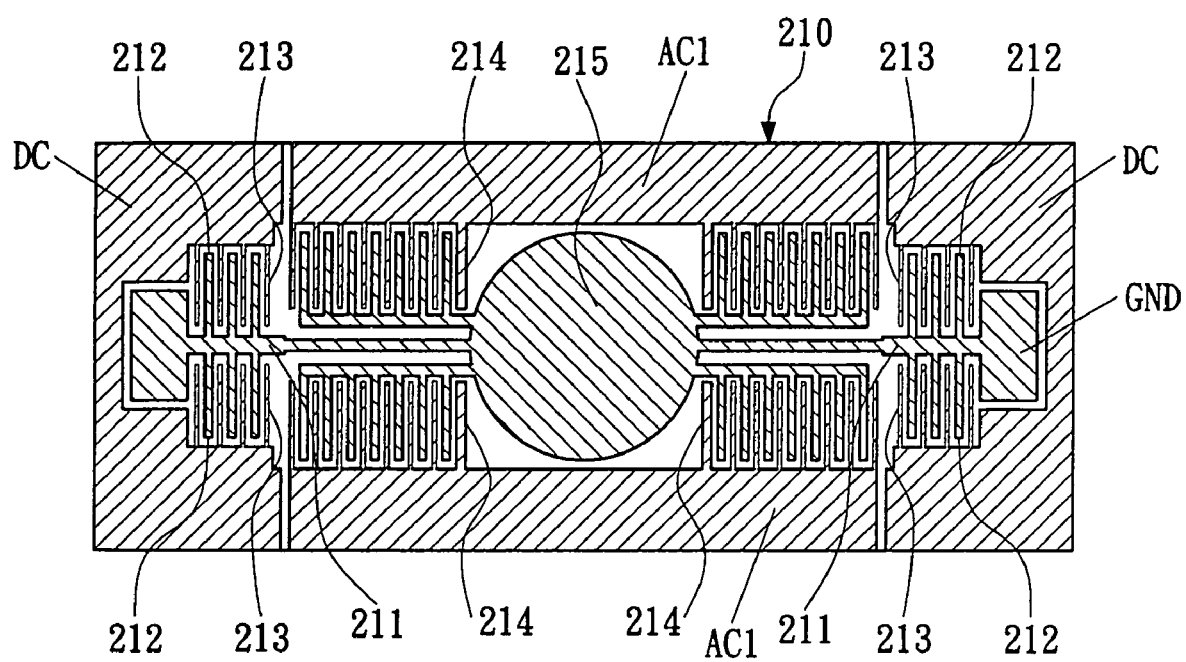
FIG. 11 illustrates another embodiment of the invention that additional in-plane comb electrodes are added to the torsional hinges and to the stationary structure on the top layer of the actuator. A voltage difference between the additional comb electrodes sets may be applied to increase the effective stiffness of the hinges.

FIG. 11 illustrates one invention embodiment to adjust the structural resonance frequency of the movable element by increasing the effective torsional stiffness of the torsional hinges. Torsional hinges are designed with comb electrodes and are interdigitated with a set of comb electrodes on the stationary structure of the top layer. This set of comb electrodes on the top stationary structure are connected to a DC voltage source and are electrically isolated from the rest of the comb electrodes on the top layer. During oscillation motion of the movable element, the voltage difference between the DC voltage and the ground will generate electrostatic attraction force between the additional comb electrodes which will suppress the torsional rotation of the portion of hinge with additional electrodes. By adjusting the voltage difference between DC and ground, the effective torsional stiffness of the hinges can be increased such that resonance frequency of the movable element can be tuned.

Figure 12:
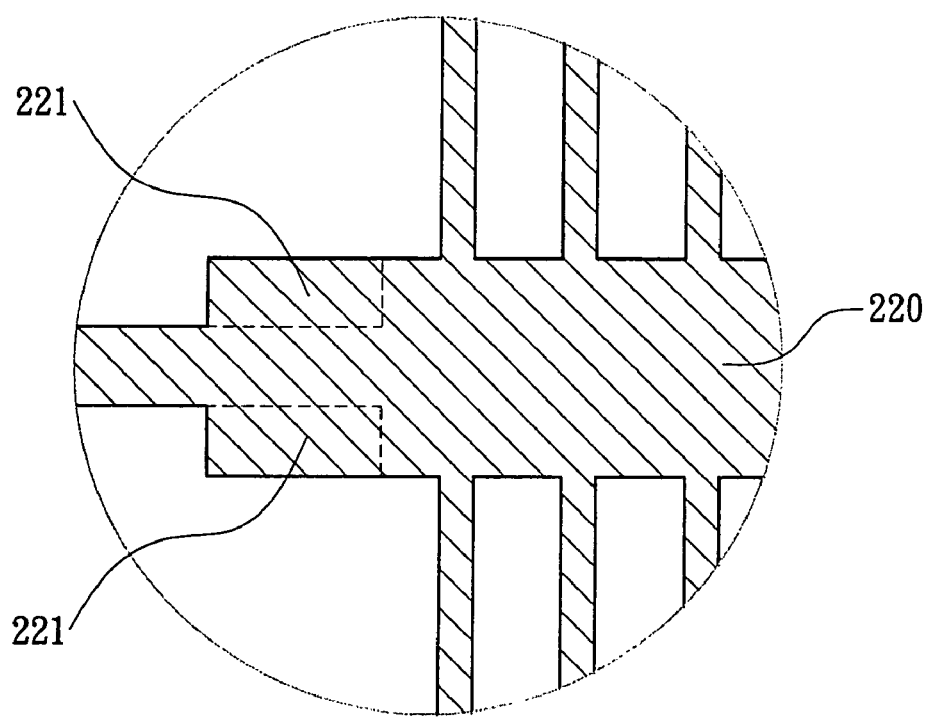
FIG. 12 illustrates the torsional hinge with protrusion areas that may be removed by laser or other means to reduce the torsional stiffness of the hinge.

FIG. 12 illustrates another invention embodiment to adjust the structural resonance frequency of the movable element by thinning portions or trimming portions of protrusions on the torsional hinges. The protrusions may be removed selectively utilizing techniques such as laser trimming, E-beam lithography, etc without damaging structural integrity. The effective torsional stiffness of the torsional hinges are reduced such that the resonance frequency of the movable element can be tuned.

What is claimed is:

1. A method of fabricating the comb-drive actuator comprising the steps of:
   etching back side of the first semiconductor wafer to define features for alignment of subsequent steps;
   etching front side of the first semiconductor wafer to specific depth to form a cavity and stationary comb electrodes by aligning to features on the back side of wafer;
   oxidizing at least one surface of a second semiconductor wafer;
   fusion bonding the first wafer with the second wafer with oxidized surface of the second wafer facing the etched cavity and comb electrodes of the first wafers;
   etching the second wafer to form the movable element and stationary element by aligning to features on the back side of the first wafer such that the comb electrodes of the moveable element are interdigitated with the comb electrodes of the stationary element which over lap the stationary comb electrodes of the first wafer but are insulated by the oxide layer.

2. A method of fabricating the comb-drive actuator comprising the steps of:
   etching back side of a Silicon-on-Insulator (SOI) wafer to form cavity, stationary comb electrodes and features for alignment of subsequent steps;
   etching front side of the SOI wafer to form the movable element and stationary element by aligning to features on the back side such that the comb electrodes of the movable element are interdigitated with the comb electrodes of the stationary element which overlap the stationary comb electrodes of on the back side but are insulated by the oxide layer.

3. A method of fabricating the comb-drive actuator comprising the steps of:
   etching back side of the first semiconductor wafer to define the features for alignment of subsequent steps;
   etching front side of the first semiconductor wafer to form cavity and stationary comb electrodes by aligning to features on the back side of wafer;
   oxidizing at least one surface of a second semiconductor wafer;
   fusion bonding the first wafer with the second wafer with oxidized surface of the second wafer facing the etched cavity and comb electrodes of the first wafers;
   etching trenches on the backside of the first wafer to electrically isolate the first wafer into two halves;
   etching the second wafer to form the movable element and stationary element by aligning to features on the back side of the first wafer such that the comb electrodes of the movable element are interdigitated with the comb electrodes of the stationary element which overlap the stationary comb electrodes of the first wafer but are insulated by the oxide layer.

4. A method of fabricating the comb-drive actuator comprising the steps of:

etching back side of the first semiconductor wafer to define the features for alignment of subsequent steps;

etching front side of the first semiconductor wafer to form cavity and stationary comb electrodes by aligning to features on the back side of wafer;

oxidizing at least one surface of a second semiconductor wafer;

fusion bonding the first wafer with the second wafer with oxidized surface of the second wafer facing the etched cavity and comb electrodes of the first wafers;

etching trenches on the backside of the first wafer to electrically isolate the first wafer into two halves;

depositing a protective layer, eg silicon nitride of the backside of the first wafer;

depositing or growing oxide on the trenches that electrically isolate the first wafer into two halves;

depositing thin film material, such as polysilicon to the trench and the back side of the first wafer such that the two halves of the first wafer are connected but electrically insulated by the oxide;

removing the polysilicon, oxide and the protective layer on the backside of the first wafer;

etching the second wafer to form the movable element and stationary element by aligning to features on the back side of the first wafer such that the comb electrodes of the movable element are interdigitated with the comb electrodes of the stationary element which overlap the stationary comb electrodes of the first wafer but are insulated by the oxide layer.

* * * * *